United States Patent
Hsu

(12) 
(10) Patent No.: US 7,322,402 B2
(45) Date of Patent: Jan. 29, 2008

(54) HEAT PIPE STRUCTURE AND METHOD FOR FABRICATING THE SAME

(76) Inventor: Hul-Chun Hsu, 6F.-3, No.422, Sec. 2, Liming Rd., Taichung City 408 (TW)

( * ) Notice: Subject to any disclaimer, the term of this patent is extended or adjusted under 35 U.S.C. 154(b) by 144 days.

(21) Appl. No.: 11/297,370

(22) Filed: Dec. 9, 2005

(65) Prior Publication Data

US 2006/0086483 A1    Apr. 27, 2006

Related U.S. Application Data

(63) Continuation-in-part of application No. 10/750,966, filed on Jan. 5, 2004, now abandoned.

(51) Int. Cl.
*F28D 15/04* (2006.01)

(52) U.S. Cl. .......................... 165/104.26; 165/104.21; 29/890.032

(58) Field of Classification Search ........... 165/104.21, 165/104.26; 29/890.032
See application file for complete search history.

(56) References Cited

U.S. PATENT DOCUMENTS

| | | | | |
|---|---|---|---|---|
| 3,720,988 A | * | 3/1973 | Waters | 29/890.032 |
| 3,789,920 A | * | 2/1974 | Low et al. | 165/104.26 |
| 3,955,619 A | * | 5/1976 | Corman et al. | 165/104.26 |
| 4,951,740 A | * | 8/1990 | Peterson et al. | 165/276 |
| 6,466,442 B2 | * | 10/2002 | Lin | 361/695 |
| 6,766,817 B2 | | 7/2004 | da Silva | |
| 2005/0011633 A1 | * | 1/2005 | Garner et al. | 165/104.26 |

OTHER PUBLICATIONS

Letter from Tubarc Technologies, LLC (2 pages).

* cited by examiner

*Primary Examiner*—Teresa J. Walberg

(57) ABSTRACT

A method for fabricating a heat pipe structure which includes a tubular member, and a woven wick structure having a base portion formed at one end of the tubular member and a surrounding portion extending from the base portion for attaching to an interior wall of the tubular member. Therefore, an end portion of a heat pipe can be used to contact a heat source for dissipation to provide more efficient dissipation and prevent from limitation of use.

16 Claims, 8 Drawing Sheets

US 7,322,402 B2

HEAT PIPE STRUCTURE AND METHOD FOR FABRICATING THE SAME

RELATED APPLICATIONS

This application is a continuation-in-part of U.S. patent application Ser. No. 10/750,966, filed on Jan. 5, 2004 now abandoned.

BACKGROUND OF THE INVENTION

The present invention relates to a heat pipe structure and a method for fabricating the heat pipe, and more particular, to a method for fabricating a heat pipe structure of which a wick structure is attached to an inner surface of an end portion thereof such that a heat pipe can be used to contact a heat source with the end portion for dissipation.

Heat pipes have been commonly used for dissipating heat generated by electronic products. The heat pipes have high thermal conducting ability, high thermal transmission, high thermal conductivity, light weight, non-mobile device, simple structure and versatile applications.

As shown in FIG. 1, the conventional heat pipe structure 1a includes two conoid ends converged from the tubular member 10a. One of the conoid end 11a is formed by soldering after a wick structure 13a is attached to an interior wall of the tubular member by a supporting member 12a. The wick structure 13a includes a screen mesh with capillary function which is advantageous for transmission of working fluid in the heat pipe 1a.

However, the conoid ends of the heat pipe 1a do not have wick structure attached or with incomplete attachment. Therefore, conventional heat pipes can not use the end portion to contact the heat sink or heat source for dissipating.

BRIEF SUMMARY OF THE INVENTION

The present invention provides a method for fabricating a heat pipe structure of which the woven wick structure is attached to the inner surface of the end portion thereof such that the heat pipe can be used to contact a heat source with the end portion for dissipation. Therefore, more availability for dissipating of the heat pipe can be obtained and further the limitation in use can be reduced too.

The heat pipe structure provided by the present invention includes a tubular member, and a woven wick structure having a base portion formed at one end of the tubular member and a surrounding portion extending from the base portion for attaching to an interior wall of the tubular member. As such, an end portion of a heat pipe can be used to contact a heat source for dissipation.

The method for fabricating the heat pipe includes providing at least one layer of woven wick, selecting a jointless and flat center portion of the woven wick as the base portion and folding upward the rest of the woven wick to form the surrounding portion extending from the base portion, and placing the woven wick inside the tubular member to attach the base portion on the inner surface of the bottom portion and attach the surrounding portion on the interior wall of the tubular member.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These, as well as other features of the present invention, will become apparent upon reference to the drawings wherein.

DETAILED DESCRIPTION OF THE INVENTION

Figure 1:
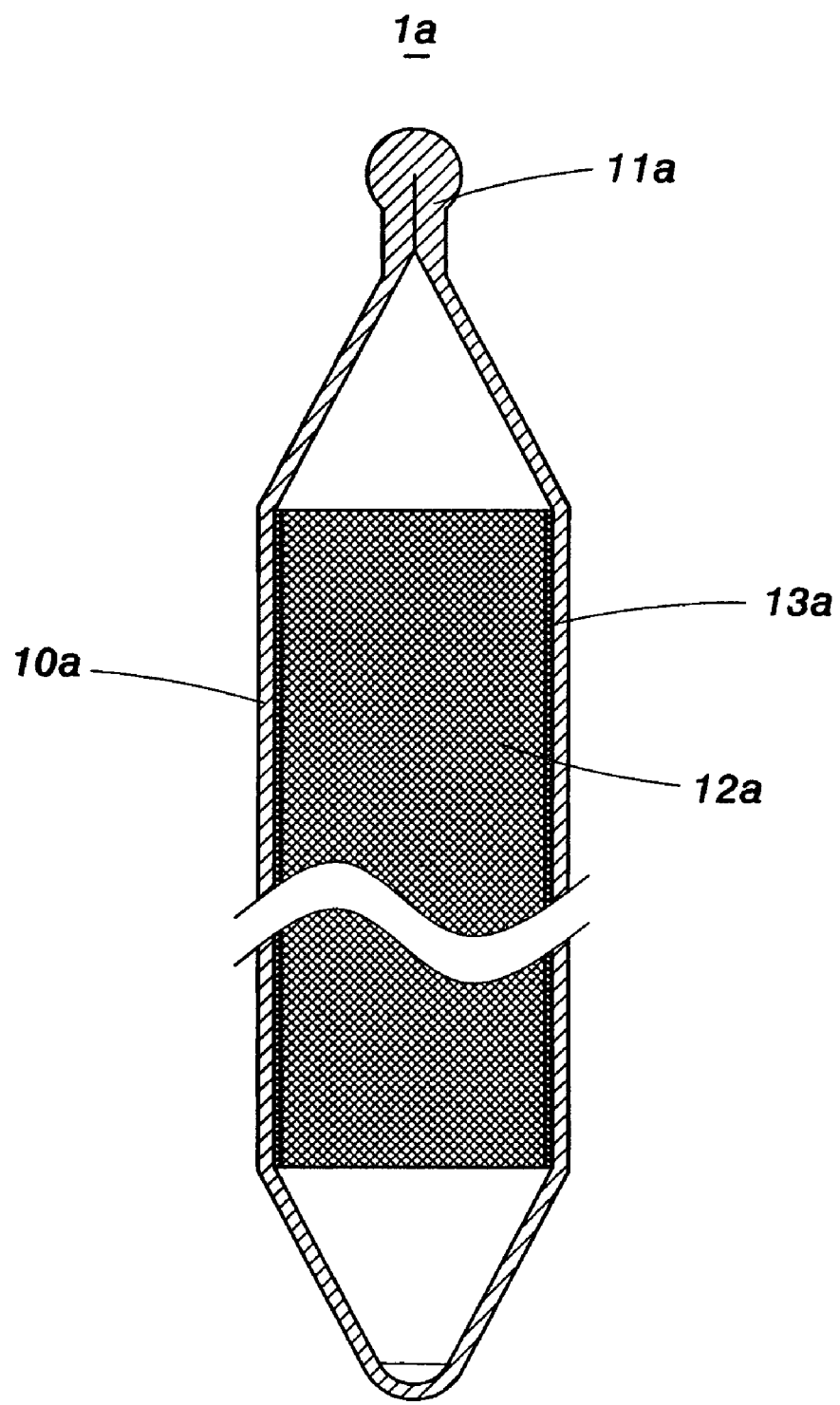
FIG. 1 shows a cross sectional view of the conventional heat pipe.

Reference will now be made in detail to the preferred embodiments of the present invention, examples of which are illustrated in the accompanying drawings. Wherever possible, the same reference numbers are used in the drawings and the description to refer to the same or like parts.

Figure 2:
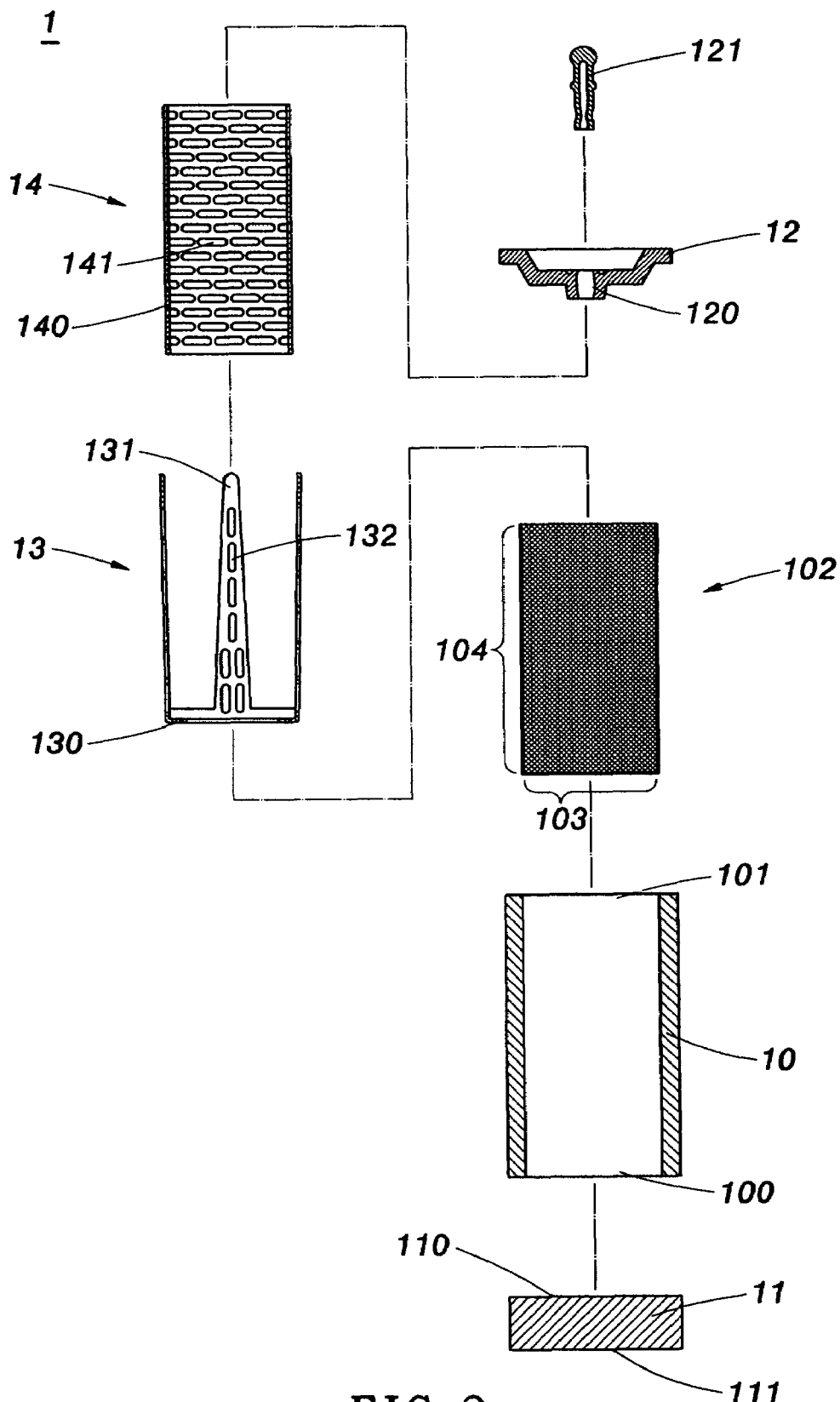
FIG. 2 shows a cross sectional view of an exploded heat pipe according to the present invention.
Figure 3:
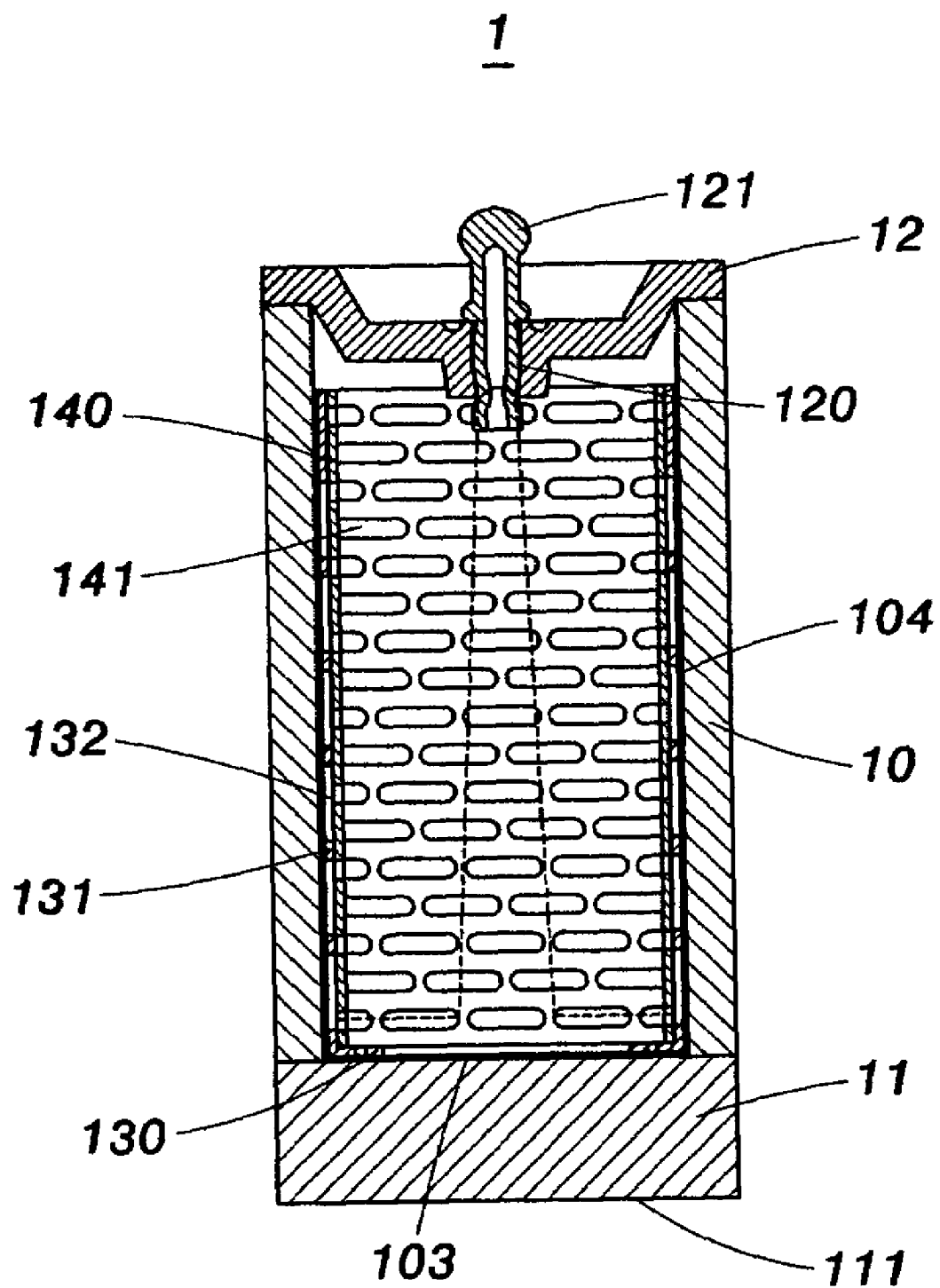
FIG. 3 shows a cross sectional view of the assembled heat pipe according to the present invention.

FIGS. 2 and 3 illustrate cross sectional views of the exploded and assembled heat pipe the present invention, respectively. As shown, the heat pipe 1 includes a tubular member 10, a bottom portion 11, a lid 12, a first support member 13 and a second support member 14.

The tubular member 10 is hollow and includes two openings 100, 101 at both ends connecting to the bottom portion 11 and the lid 12, respectively. The bottom portion 11 has an inner surface 110 and an outer surface 111. The inner surface 110 can be formed as a plane surface, a conical surface, a convex surface or a concave surface. Further, the bottom portion 11 can be integratedly formed with the tubular member 10. The lid 12 includes a through hole 120 for an injection tube 121 being installed therein so that the working fluid can be filled into the heat pipe thereby.

Figure 4:
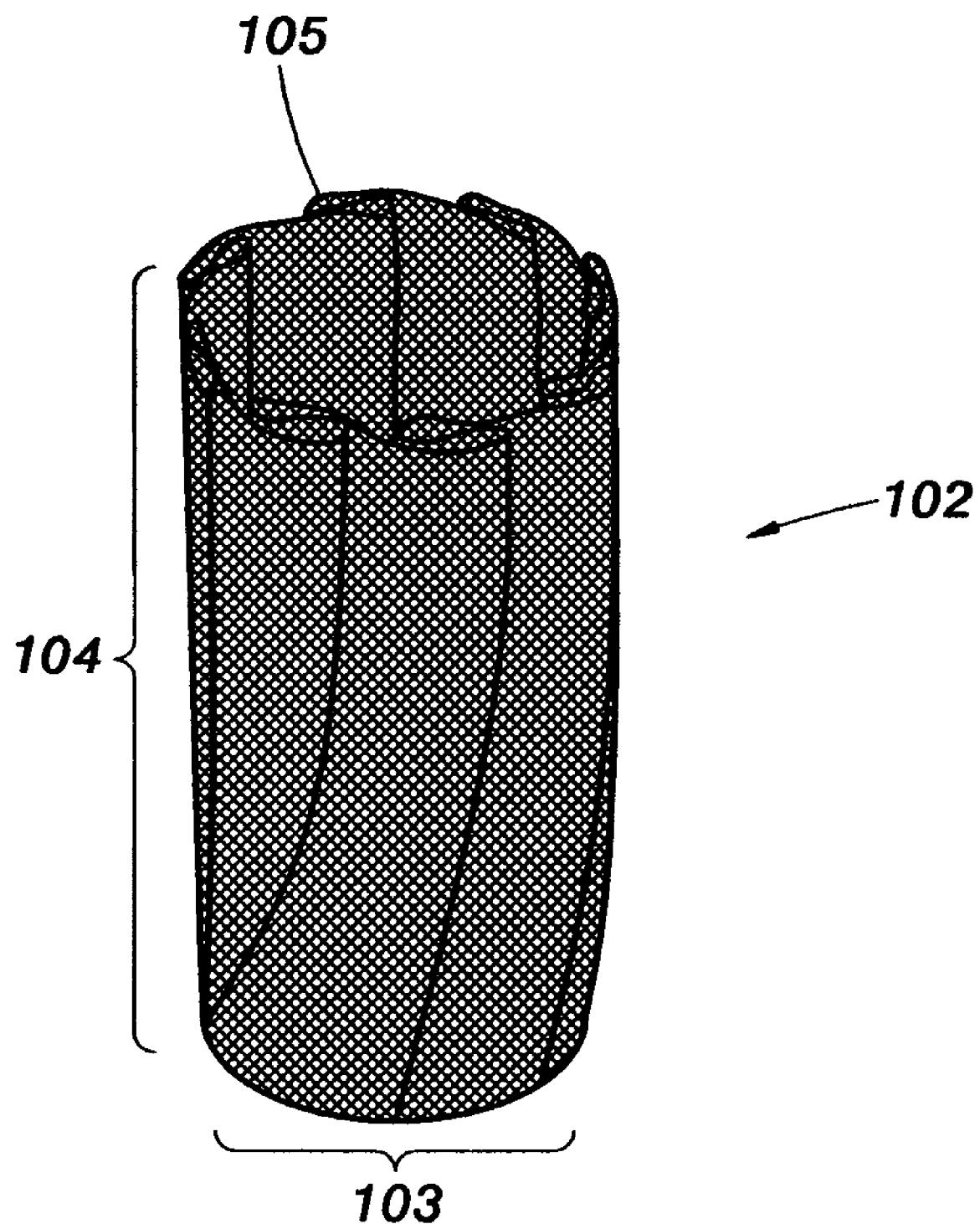
FIG. 4 shows a perspective view of a wick structure according to the first embodiment.
Figure 5:
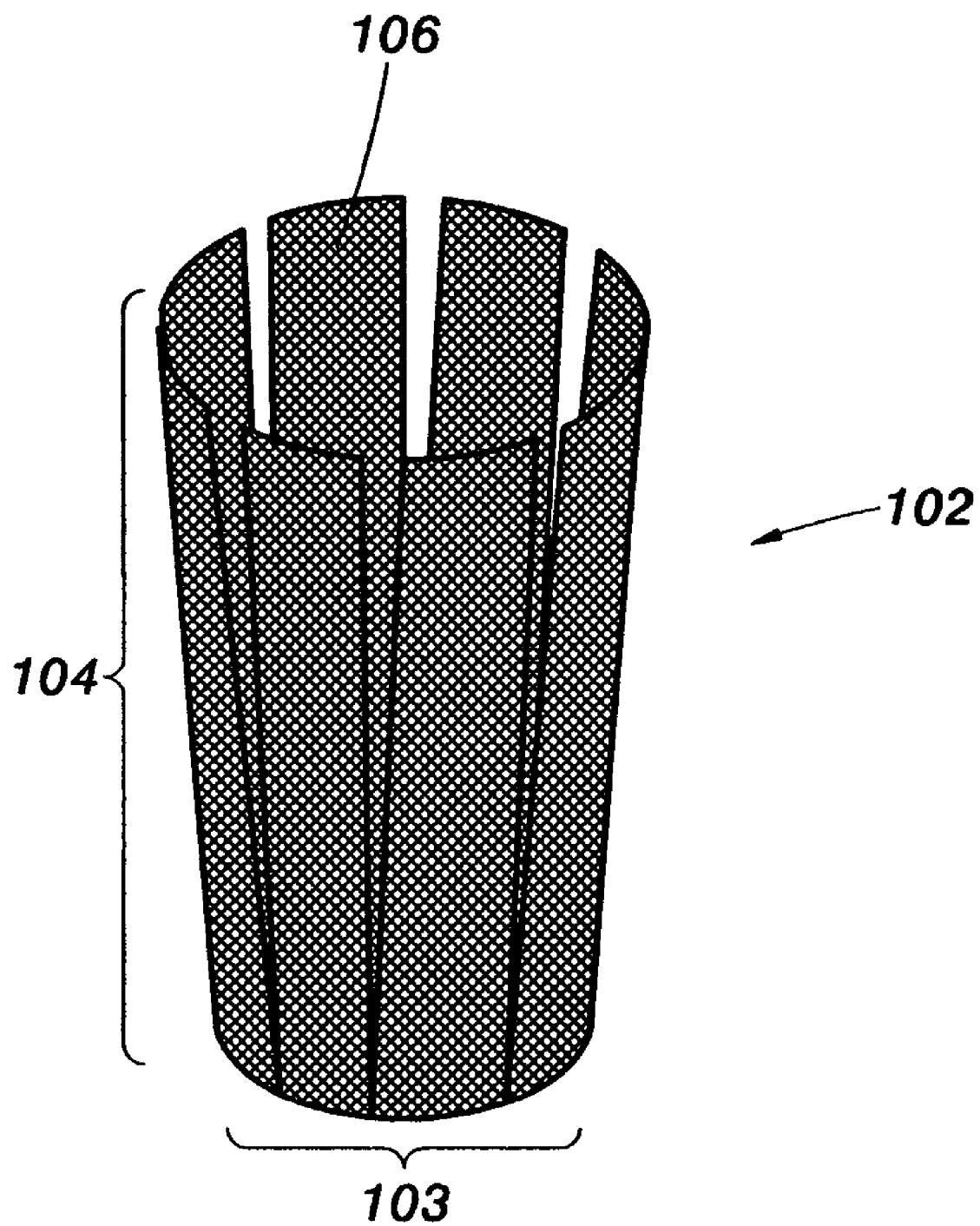
FIG. 5 shows a perspective view of a wick structure according to the second embodiment.

Furthermore, a woven wick structure 102 having a base portion 103 and a surrounding portion 104 extending therefrom is mounted inside the tubular member 10 of the heat pipe 1. The base portion 103 is attached to the inner surface 110 of the bottom portion 11 and the surrounding portion 104 is attached to the interior wall of the tubular member 10. Please refer to FIGS. 4 and 5, which show different wick structures according to a first and a second preferred embodiments of the present invention. As shown in FIG. 4, the surrounding portion 104 of the wick structure 102 is formed as a skirt structure including a plurality of frills 105. The skirt structure of the surrounding portion 104 is formed by folding the frills 105 upwards from the base portion 103. In another embodiment, as shown in FIG. 5, the surrounding portion 104 of the wick structure 102 includes a plurality of strips 106 with smoother surface after the wick structure 102 is mounted to the heat pipe by sintering.

Figure 6:
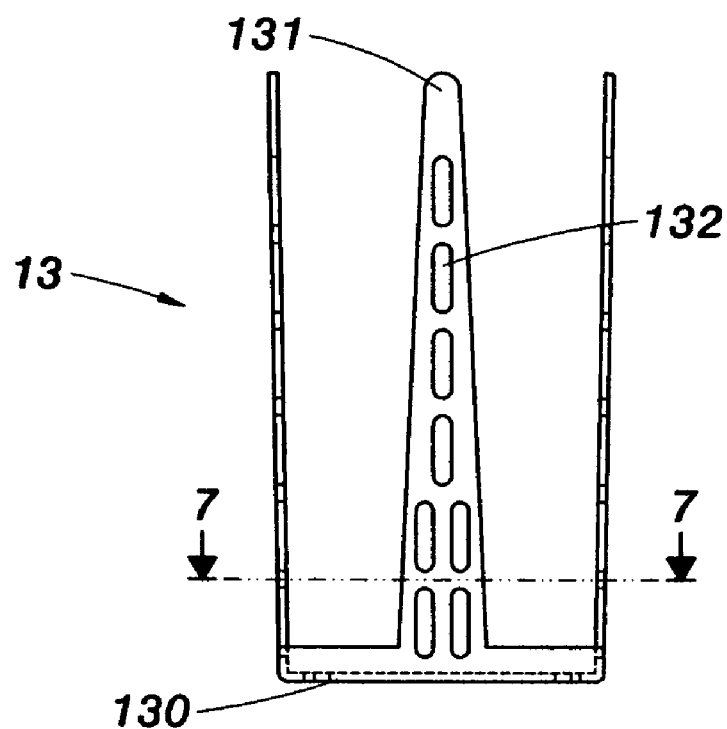
FIG. 6 shows a cross sectional view of the first supporting member in FIG. 2.
Figure 7:
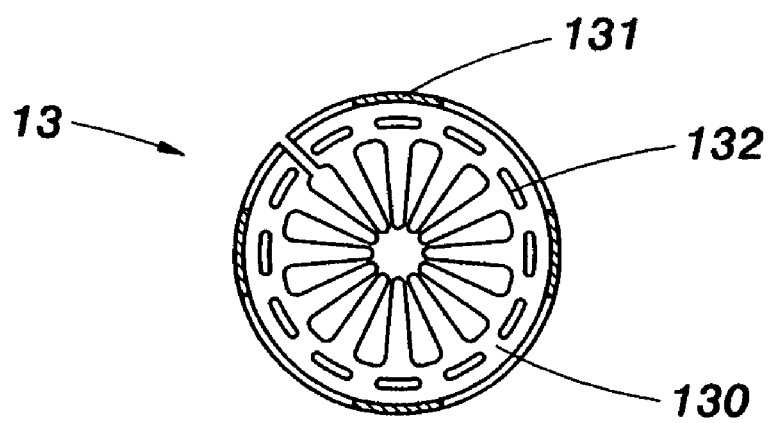
FIG. 7 shows a cross sectional view along line 7-7 of FIG. 6.

FIGS. 6 and 7 illustrate the cross sectional view of the first support member and the cross sectional view along line 7-7 of FIG. 6, respectively. The support member 13 installed inside the tubular member 10 includes a pressing plate 130 and an elastic arm 131 extending therefrom. The pressing plate 130 is for pressing the base portion 103 of the wick structure 102 on the inner surface 110 of the bottom portion 11 of the heat pipe 1. The elastic arm 131 is for pressing the surrounding portion of the wick structure 102 on the interior wall of the tubular member 10 of the heat pipe 1. The elastic arm 131 can provide auxiliary force to secure the attachment of the wick structure 102 to the bottom portion 11. Further, the first support member 13 includes a plurality of holes 132 on the pressing plate 130 and the elastic arm 131 for the working fluid flowing therethrough.

Figure 8:
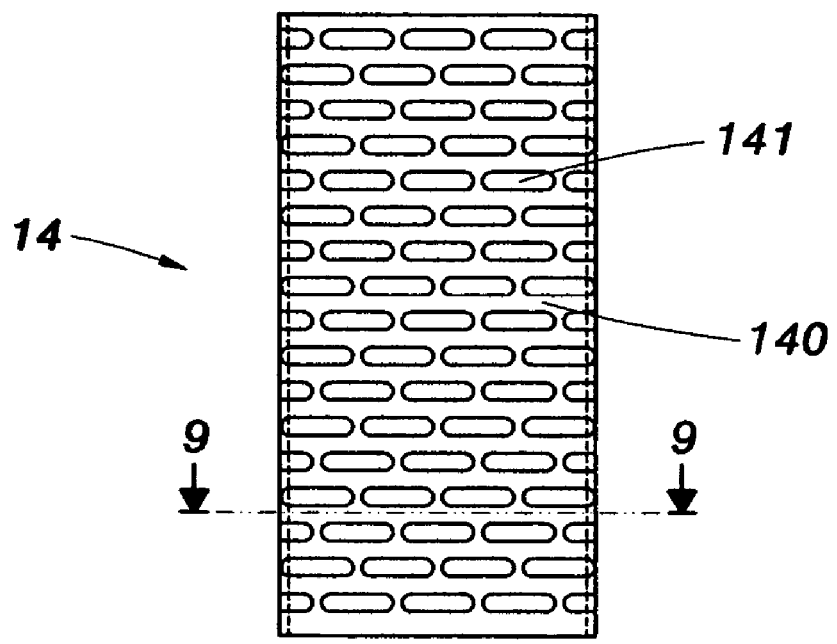
FIG. 8 shows a cross sectional view of the second supporting member in FIG. 2.
Figure 9:
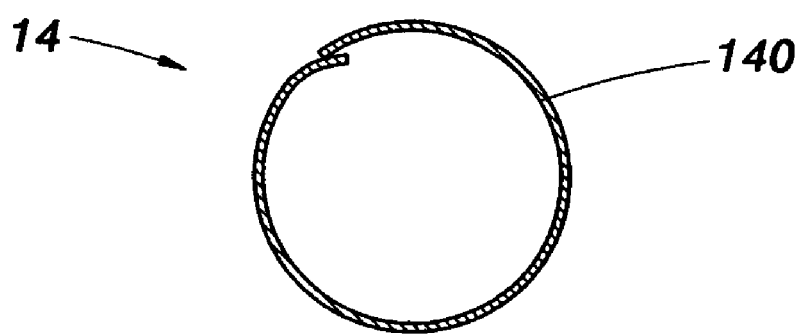
FIG. 9 shows a cross sectional view along line 9-9 of FIG. 8.

FIGS. 8 and 9 illustrate the cross sectional view of the second support member and the cross sectional view along line 9-9 of FIG. 8, respectively. The second support member 14 is also installed inside the tubular member 10, and is formed by curling a resilient sheet 140 with a plurality of holes 141 thereon or formed as a spiraling spring (not shown). The second support member 14 is mounted between the elastic arm 131 of the first support member 13 for further securing the surrounding portion 104 of the wick structure 102 being attached to the tubular member 10. Meanwhile, if there is no first support member 13, the second support member 14 can be directly mounted inside the tubular member 10 to press the surrounding portion 104 being attached to the tubular member 10.

As such, according to the above description, the heat pipe structure of the present invention is obtained.

Figure 10:
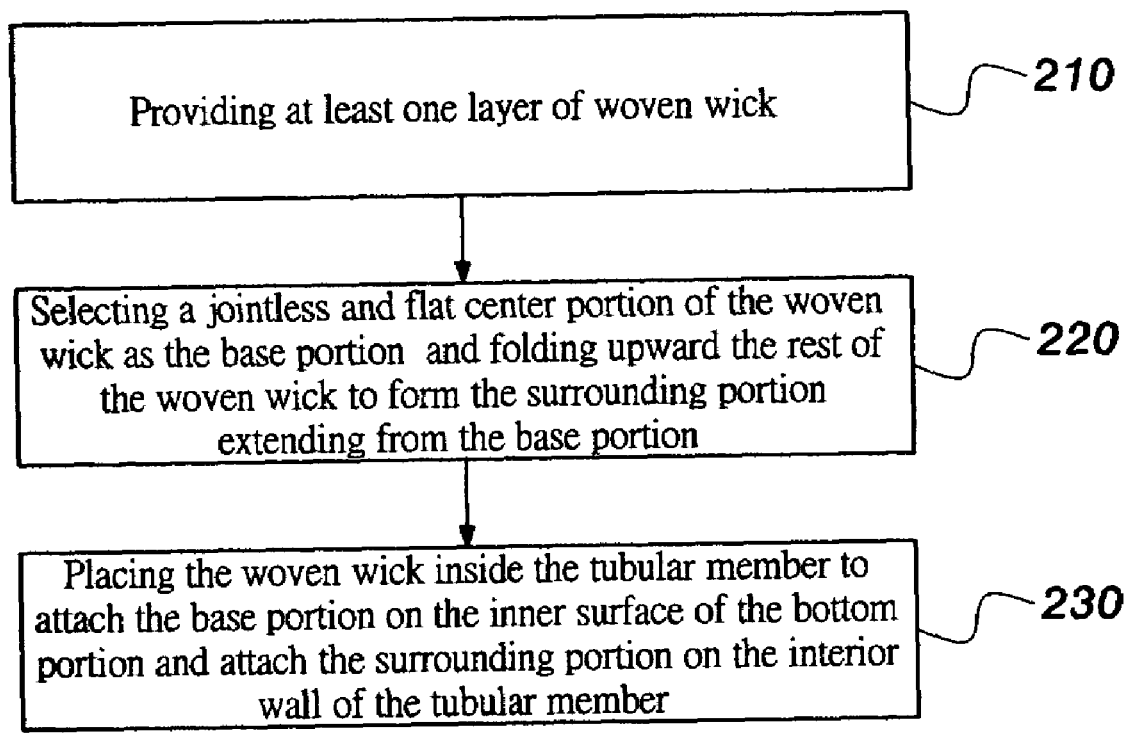
FIG. 10 show a flow chart of the method for fabricating the heat pipe of the present invention.

Referring to FIG. 10, the method for fabricating the heat pipe includes providing at least one layer of woven wick 102 (Step 210), selecting a jointless and flat center portion of the woven wick 102 as the base portion 103 and folding upwards the rest of the woven wick 102 to form the surrounding portion 104 extending from the base portion 103 (Step 220), and placing the woven wick 102 inside the tubular member 10 to attach the base portion 103 on the inner surface 110 of the bottom portion 11 and attach the surrounding portion 104 on the interior wall of the tubular member 10 (Step 230).

Finally, as shown in FIG. 3, the bottom portion 11 of the heat pipe 1 can be used to contact the heat source with the outer surface 111. The working fluid near the bottom portion 11 is gradually evaporated and then condensed to liquid on the interior wall of the tubular member 10. Thereafter, the liquid working fluid flows back to the bottom portion 11 and is heated to evaporate again. As such, the heat pipe 1 of the present invention can use an end portion for heat conduction and dissipation to provide more efficient dissipation and reduce the limitation in use of the heat pipe. The heat pipe structure of the present invention is more suitable to be used for the central processing unit (CPU) of a computer because the end portion of the heat pipe can be directly contact to the CPU for dissipation.

This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A heat pipe structure, comprising:
   a tubular member;
   a first support member mounted inside the tubular member, including a pressing plate and an elastic arm extending from the pressing plate, and a plurality of holes formed on the pressing plate and the elastic arm;
   a bottom portion to be used as a heat input surface to contact a heat source, connected to a first end of the tubular member;
   a lid connected to a second end of the tubular member; and
   a woven wick structure including a base portion formed at the bottom portion of the tubular member, and a surrounding portion extending from the base portion for attaching to an interior wall of the tubular member.

2. The structure of claim 1, wherein an inner surface of the bottom portion is a plane surface.

3. The structure of claim 1, wherein the bottom portion is integratedly formed with the tubular member.

4. The structure of claim 1, wherein the lid has a through hole for installing an injection tube to fill working fluid.

5. The structure of claim 1, wherein the surrounding portion is formed as a skirt structure with a plurality of frills.

6. The structure of claim 1, wherein the surrounding portion includes a plurality of strips extended from the base portion.

7. The structure of claim 1, further comprising a second support member mounted to the first support member.

8. The structure of claim 7, wherein the second support member is formed by curling a resilient sheet and a plurality of holes is formed on the resilient sheet.

9. The structure of claim 1, further comprising a second support member mounted inside the tubular member.

10. The structure of claim 9, wherein the second support member is formed by curling a resilient sheet and a plurality of holes is formed on the resilient sheet.

11. A heat pipe structure, comprising:
   a tubular member having a first end connecting a bottom portion, a second end and a first supporting member inside the tubular member where the first supporting member includes a pressing plate and an elastic arm extending from the pressing plate, and a plurality of holes formed on the pressing plate and the elastic arm, where the bottom portion can be used as a heat input surface; and
   a wick structure including a base portion formed at the bottom portion of the tubular member, and a surrounding portion extending from the base portion for attaching to an interior wall of the tubular member.

12. The structure of claim 11, further comprising a second support member mounted to the first support member.

13. The structure of claim 12, wherein the second support member is formed by curling a resilient sheet and a plurality of holes is formed on the resilient sheet.

14. A method for fabricating a heat pipe with a bottom portion contacting to a heat source, the method comprising:
   providing at least one layer of woven wick;
   selecting a jointless and flat center portion of the woven wick as a base portion and folding upwards the rest of the woven wick to form a surrounding portion extending from the base portion; and
   placing the woven wick inside a tubular member of the heat pipe to attach the base portion on an inner surface of the bottom portion and attach the surrounding portion on an interior wall of the tubular member.

15. The method of claim 14, further comprising forming the surrounding portion as a skirt structure with a plurality of frills.

16. The method of claim 14, further comprising forming the surrounding portion as a plurality of strips extended from the base portion.

* * * * *